United States Patent [19]

Huang et al.

[11] 4,156,842
[45] May 29, 1979

[54] IMMITANCE MEASUREMENT WITH HIGH FREQUENCY INJECTION AND ELECTROMAGNETIC COUPLING

[75] Inventors: Kwang Ta Huang, Ventura; James L. Brooks; Dallas M. Shiroma, both of Oxnard, all of Calif.

[73] Assignee: The United States of America as represented by the Secretary of the Navy, Washington, D.C.

[21] Appl. No.: 882,699

[22] Filed: Mar. 2, 1978

[51] Int. Cl.² .......................................... G01R 27/00
[52] U.S. Cl. ................................ 324/57 R; 324/62; 324/127
[58] Field of Search ............ 324/57 R, 51, 62, 60 R, 324/127

[56] References Cited
U.S. PATENT DOCUMENTS

| | | | |
|---|---|---|---|
| 3,582,774 | 6/1971 | Forgacs | 324/57 R |
| 3,771,057 | 11/1973 | Persidok | 324/57 R |
| 3,818,331 | 6/1974 | Schlosser | 324/57 R |
| 3,818,332 | 6/1974 | Schlosser | 324/57 R |
| 4,023,095 | 5/1977 | Walters | 324/57 R |

*Primary Examiner*—Stanley T. Krawczewicz
*Attorney, Agent, or Firm*—Richard S. Sciascia; Joseph M. St. Amand; Andrew S. Viger

[57] ABSTRACT

A system for measuring the transfer immitances, impedance and admittance, of a linear electrical network having one or more ports. The system utilizes clamp-on ferromagnetic cores to electromagnetically couple the transfer immitance measuring system to the electrical network without having to interrupt the normal on-line operation of the electrical network. A high frequency injection network, which includes a high frequency signal generator and a multichannel amplifier, injects a high frequency signal into each of the ports of the electrical network. High frequency voltage and current measuring networks are electromagnetically coupled to each of the ports of the electrical network to measure the high frequency component of the port voltage and the port current. By adjusting the relative amplitude and phase of each of the injected high frequency signals, open- and closed-circuit conditions, in the high frequency range, can be simulated in the ports of the electrical network, permitting the transfer immitances of the electrical network to be established without interrupting normal, on-line operation.

47 Claims, 4 Drawing Figures

IMMITANCE MEASUREMENT WITH HIGH FREQUENCY INJECTION AND ELECTROMAGNETIC COUPLING

BACKGROUND OF THE INVENTION

An electrical power network includes various power distributing elements together with certain loads. The properties of the power distributing elements are generally specified by the manufacturer for 60-Hz, using such standard measurements as open-circuit impedance and short-circuit admittance. These characteristic immitance tests cannot be duplicated without affecting the normal on-line operation of the network because the network loads must be disconnected before either open- or short-circuit tests can be performed. However, in certain power distribution or conversion networks, as well as other electrical networks and pieces of equipment, it would be advantageous to be able to perform standard immitance tests and measurements while the various elements of the network are in operation.

SUMMARY OF THE INVENTION

It is therefore an object of the present invention to provide a transfer immitance measurement system for measuring the transfer immitances, impedance and admittance, of a linear electrical network, having one or more ports, without interrupting the normal on-line operation of the electrical network.

A further object of the present invention is to provide an immitance measuring system which utilizes electromagnetic coupling.

Another object of the present invention is to provide an immitance measuring system incorporating controlled, high frequency injection to simulate, in the high frequency range, open- and short-circuit conditions in the ports of the electrical network.

Accordingly, to accomplish these and other objects, the present invention provides a transfer immitance measurement system for measuring the transfer immitances, impedance and admittance, of a linear electrical network having one or more ports. High frequency signals are injected into the electrical network, superimposing a high frequency excitation and response onto the excitation and response associated with the normal, on-line operation of the electrical network. In this high frequency range, open- and short-circuit conditions in the ports of the electrical network are simulated and the characteristic transfer immitances are determined by performing high frequency voltage and current measurements. By utilizing electromagnetic coupling, high frequency injection and high frequency current and voltage measuring can be performed without interrupting the normal on-line operation of the electrical network.

The injection of high frequency signals into the electrical network is accomplished by means of a high frequency injection network electromagnetically coupled to each of the ports of the electrical network by means of clamp-on ferromagnetic cores. The injection network, which includes a high frequency signal generator, a phase shift network and a multichannel amplifier, introduces a superimposed high frequency signal into each of these ports. The relative amplitudes and phases of the injected high frequency signals are controlled by means of the gain controls on the multichannel amplifier and the phase shift network. By carefully adjusting the relative amplitudes and phases of the injected high frequency signals, the injection network can produce in the high frequency range artificial open- and short-circuit conditions in the ports of the electrical network.

The characteristic transfer immitances of the electrical network are determined by measuring high frequency voltages and currents in the ports of the electrical network during the simulated open- and short-circuit conditions. These measurements are performed by high frequency voltage and current measuring networks which include wave analyzers. The wave analyzers in the high frequency voltage and current measuring networks are electromagnetically coupled by means of clamp-on ferromagnetic cores to the ports of the electrical network, the voltage measuring networks being coupled to shunt capacitors coupled across the ports. In this manner, the open-circuit impedance and the short-circuit admittance of the electrical network can be established by measurements in the high frequency range only, obviating the need to interrupt the on-line operation of the electrical network.

The novel features believed to be characteristic of the present invention are set forth in particularlity in the appended claims. However, a more complete appreciation of the present invention, both as to organization and mode of operation, and many of the attendant advantages thereof will result as the same becomes better understood be reference to the following detailed description when considered in conjunction with the accompanying drawings.

DESCRIPTION OF THE PREFERRED EMBODIMENTS

The transfer immitances of a linear (capacitors, inductors, and resistors) electrical network are said to characterize the electrical network; that is, the response of the electrical network to any given excitation can be predicted. The characteristics of such linear electrical network are described by the matrix equations:

$$[V] = [Z][I] \tag{1}$$

$$[I] = [Y][V] \tag{2}$$

Where [Z] is the impedance matrix and [Y] is the admittance matrix. The general expression for the elements of the impedance matrix is:

$$Z_{ij} = \frac{V_i}{I_j} \bigg|_{\substack{I_k = 0 \\ \text{all } k \\ k \neq j}} \tag{3}$$

The expression for the elements in the admittance matrix is:

$$Y_{ij} = \left.\frac{I_i}{V_j}\right|_{\substack{V_k = 0 \\ \text{all } k \\ k \neq j}} \qquad (4)$$

The impedances $Z_{ij}$ are measured with various currents set to zero, which implies open circuits. Thus, the z-parameters are referred to as the open-circuit parameters of the linear electrical network. The admittances $Y_{ij}$, on the other hand, are measured with various voltages set to zero, which implies short circuits, and are called the short-circuit parameters. Accordingly, by performing open- and short-circuit tests on a linear electrical network, the characteristic impedance Z or admittance Y parameters of the electrical network can be determined. However, both the impedance and admittance parameters are not required to characterize the electrical network because, if one is known, the other can be calculated. Since $$[V] = [Z][I]$$

and $$[I] = [Y][V]$$

then $$[V] = [Z][Y][V]$$

Thus, the product [Z][Y] must be given the identity matrix or $$[Z] = [Y]^{-1} \qquad (5)$$

$$[Y] = [Z]^{-1} \qquad (6)$$

If either [Z] or [Y] can be determined, then the characteristic response of the linear electrical network for any given excitation can be calculated.

For the linear electrical network, the superposition theorem states that the total response to a number of sources is equal to the sum of the responses to each source. If the element is excited by a 60-Hz signal and a high frequency signal then $$[V] = [V_{60\,Hz}] + [V_h] \qquad (7)$$

$$= [Z][I_{60\,Hz}] + [Z][I_h]$$

where [V] represents the total response; $[V_{60\,Hz}]$ and $[I_{60\,Hz}]$ represent the response to 60 Hz only; and $[V_h]$ and $[I_h]$ represent the response to a high frequency signal only. And, since $[V_h] = [Z][I_h]$, the electrical network can be characterized (that is, the impedance can be determined) by measurement of the high frequency signal only. A similar derivation can be used to show that $[I_h] = [Y][V_h]$; again only high frequency measurements are required to define the characteristic admittance. Thus, if open- or short-circuits can be simulated for high frequency signals, and the high frequency components of voltage and current measured, then the z- or y-parameters characterizing the linear electrical network can be measured with no affect on the 60-Hz operation of the electrical network.

Figure 1:
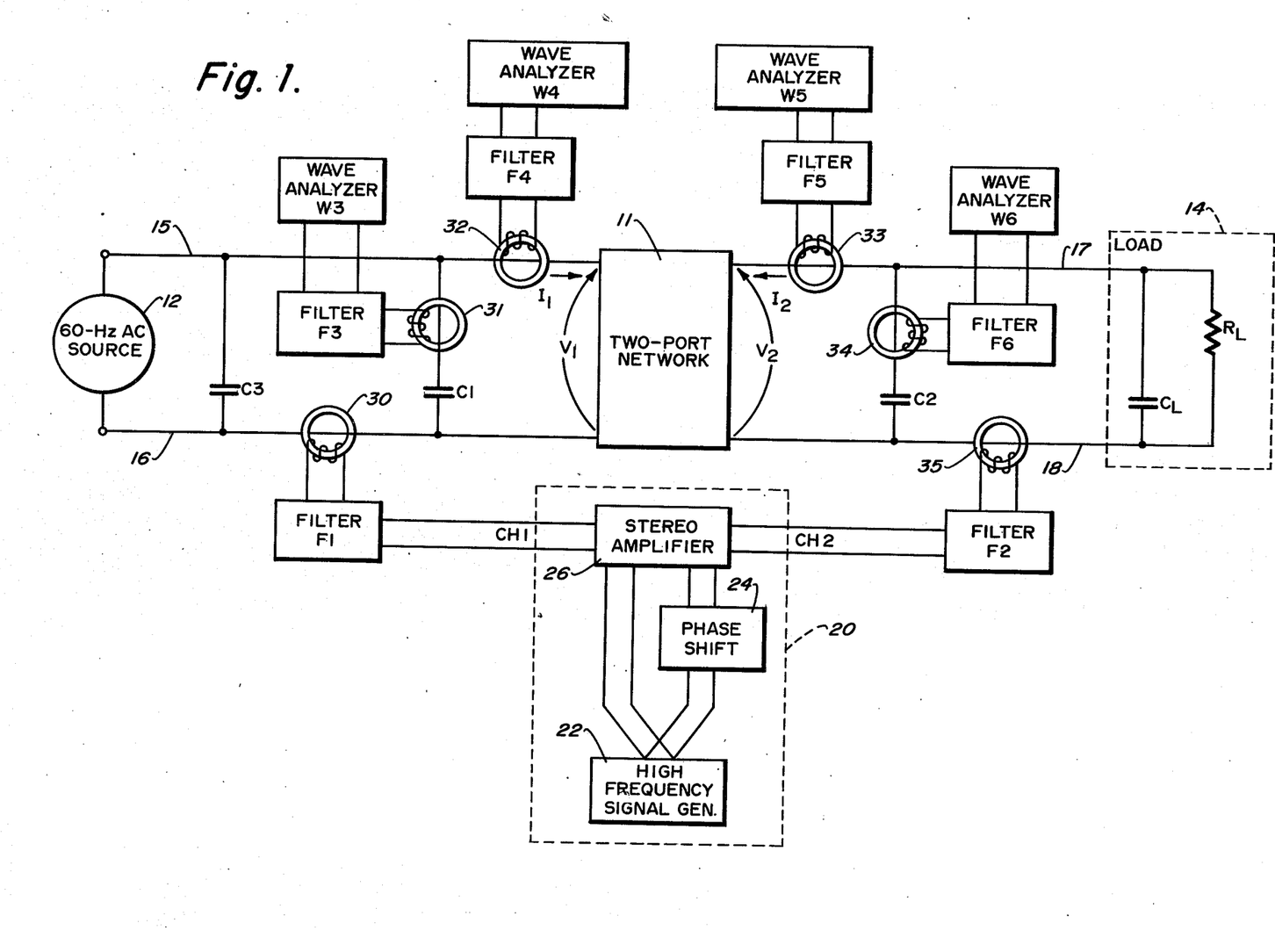
FIG. 1 is a schematic block diagram of the transfer immitance measuring system for establishing the characteristic transfer immitances of a generalized two-port network in accordance with the present invention.

Referring now to the drawings wherein like reference characters designate like or corresponding elements throughout the several views, FIG. 1 shows a linear (i.e., comprised of capacitors, inductors and resistors only) two-port electrical network indicated generally at 11. A 60-Hz ac power source 12 is coupled to one port of the electrical network via lines 15 and 16. This port is characterized by a port current $I_1$ and a port voltage $V_1$. The other port of the electrical network is coupled via lines 17 and 18 to a load 14, represented by a reactance $C_L$ and a resistance $R_L$. This port is characterized by a port current $I_2$ and a port voltage $V_2$. This generalized two-port electrical network will be used in the ensuing discussion of the transfer immittance measurement system of the present invention. However, it will be understood and appreciated by those acquainted with the art that the transfer immittance measurement system described herein can be readily generalized for linear electrical networks with any number of ports.

In accordance with the above described technique for determining the characteristic z- and y-parameters for a linear electrical network, the present system for measuring the transfer immittances for the two-port linear electrical network 11 includes means for injecting a high frequency signal into each of the ports of electrical network 11, means for measuring the high frequency component of port currents $I_1$ and $I_2$, and means for measuring the high frequency component of port voltages $V_1$ and $V_2$. A high frequency signal generating network, shown generally at 20, comprises a high frequency signal generator 22, a phase shift network 24 and a stereo power amplifier 26. The single high frequency signal generator 22 in combination with power amplifier 26, generates the high frequency signals for both ports of electrical network 11. This ensures that both signals injected into the electrical network have precisely the same frequency. The oscillator output from high frequency signal generator 22 is fed directly into one channel of stereo power amplifier 26 and through phase shift network 24 into the other channel of the power amplifier.

Figure 4:
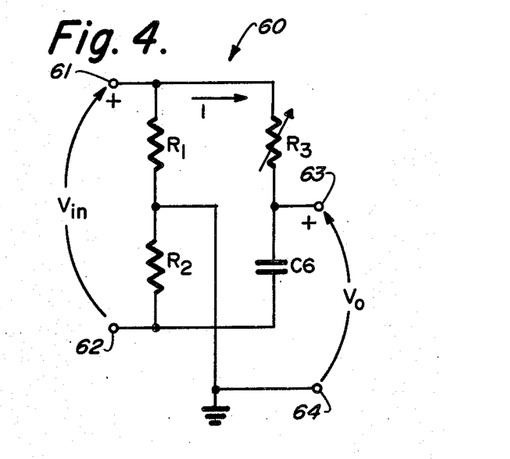
FIG. 4 is a circuit diagram of a phase shift circuit for the high frequency signal injection network according to the present invention.

Stereo power amplifier 26 incorporates independent gain control for both output channels, indicated generally as CH1 and CH2. In addition, phase shift network 24, shown schematically in FIG. 4 provides a means for changing the phase of the high frequency signal on output channel CH2 of stereo power amplifier 26. FIG. 4 shows the parallel combination of a resistor $R_1$ in series with a resistor $R_2$ and a potentiometer $R_3$ in series with a capacitor $C_6$. The input (indicated as $V_{in}$) high frequency signal from high frequency signal generator 22 appears across terminals 61 and 62 while the phase-shifted output (indicated as $V_o$) appears on terminals 63 and 64. As potentiometer $R_3$ is adjusted, the angular displacement between $V_{in}$ and $V_o$ is changed without affecting the magnitude of $V_o$. Thus, the output of stereo power amplifier 26 comprises two high frequency signals of the same frequency but with different amplitude and phase. As will be discussed below, the phase and amplitude controls afforded by the stereo power amplifier 26 and phase shift network 24 are essential to simulating the open- and short-circuit conditions necessary to determine the characteristic z- and y-parameters of the transfer immittances for electrical network 11.

In order to superimpose a high frequency excitation and response onto the normal 60-Hz excitation and response, the high frequency signals appearing on output channels CH1 and CH2 are electromagnetically injected into respective ports of electrical network 11.

Thus, the high frequency signal appearing on output channel CH1 is fed via a filter F1 to a clamp-on ferromagnetic core 30, positioned around line 16. Similarly, the high frequency signal appearing on output channel CH2 is fed via filter F2 to a clamp-on ferromagnetic core 35 positioned about line 18. In this manner, high frequency signals can be injected into both ports of electrical network 11 without interrupting the normal on-line operation of the electrical network.

In accordance with equation (7), the characteristic impedance and admittance of electrical network 11 can be established from V-I measurements in the superimposed high frequency range. To measure the high frequency components of the port voltages $V_1$ and $V_2$ and the port currents $I_1$ and $I_2$, the present transfer immitance measurement system utilizes a basic detection network comprised of a clamp-on ferromagnetic core, a filter and a wave analyzer. Wave analyzers are used to provide the high selectivity and accuracy needed to accurately measure the injected high frequency signals while filtering out the noise, 60-Hz signal, and harmonics attendant to the on-line operation of electrical network 11. These features are important to the successful characterization of electrical network 11 by means of the electromagnetic coupling and high frequency injection techniques employed by the transfer immitance measurement system according to the present invention.

For measuring the high frequency component of port current $I_1$, FIG. 1 shows a clamp-on ferromagnetic core 32 (positioned around line 15), coupled through a filter F4 to a wave analyzer W4. The high frequency component of port current $I_2$ is measured by means of a clamp-on ferromagnetic core 33 (positioned around line 17), coupled through a filter F5 to a wave analyzer W5. In order to measure the high frequency components of the port voltages $V_1$ and $V_2$, shunt capacitances $C_1$ and $C_2$ are placed across respective ports of electrical network 11. The values of these shunt capacitances are chosen to present a low impedance path to high frequency signals while presenting a high impedance (open circuit) barrier to the 60-Hz power signal. The high frequency current through shunt capacitors $C_1$ and $C_2$ is measured from which the high frequency component of port voltages $V_1$ and $V_2$, respectively, can be determined. Accordingly, the high frequency current through capacitor $C_1$ is measured by means of a clamp-on ferromagnetic core 31 coupled through a filter F3 to a wave analyzer W3, while the high frequency current through capacitor $C_2$ is measured by means of a clamp-on ferromagnetic core 34 coupled through a filter F6 to a wave analyzer W6.

Employing electromagnetic coupling to perform the high frequency voltage and current measurements associated with the present transfer immitance measurement system can give rise to two significant problems. One is the need to filter out the 60-Hz component, together with its harmonics, which is induced in the clamp-on ferromagnetic core. This problem can manifest itself in two contexts; first, the 60-Hz component and its harmonics can directly interfere with the accurate measurement of the high frequency components of voltage and current, and second, these signals can modulate and thereby distort the injected high frequency signals. The other problem is that the ferromagnetic cores used in the present invention for electromagnetic coupling tend to saturate in the presence of high 60-Hz currents (as are usually found in power applications), resulting in non-linear characteristics being introduced into the high frequency injection and high frequency voltage and current measuring networks. The filters F1 through F6 (FIG. 1) associated with respective clamp-on ferromagnetic cores 30, 35 and 31 to 34 are incorporated into the transfer immitance measuring system of the present invention to prevent or minimize these problems.

Figure 3:
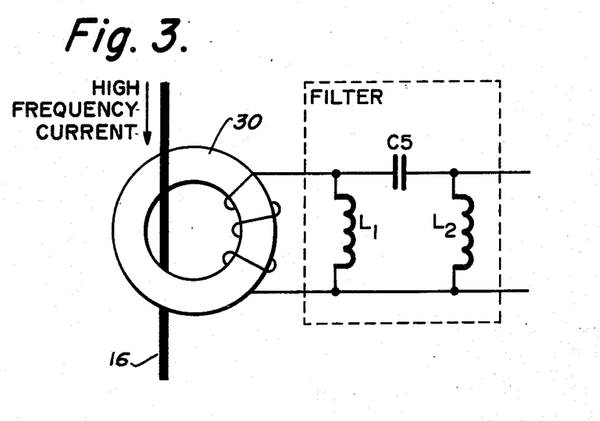
FIG. 3 is a schematic diagram of a ferromagnetic core together with an associated $\pi$-section filter in accordance with the present invention.

Referring to FIG. 3, it shows a representative ferromagnetic core 30 together with its associated filter F1; although the following discussion applies equally to other filters associated with the ferromagnetic cores utilized in the high frequency injection and high frequency voltage and current measuring networks of the present transfer immitance measuring system. Filter F1 is a $\pi$-section filter comprised of shunt inductor $L_1$, a series capacitor $C_5$ and shunt inductor $L_2$. To minimize the modulating and interference effects of the 60-Hz signal and its harmonics on the high frequency injection and high frequency voltage and current measuring networks, the L-section filter comprised of series capacitor $C_5$ and shunt inductor $L_2$ is utilized for 60-Hz signal attenuation. And, to prevent clamp-on ferromagnetic core 30 from saturating, shunt inductor $L_1$ is placed across the ferromagnetic core. The value of shunt inductor $L_1$ is chosen to yield a linear I-V relationship (I being the current in line 16 and V being the voltage across shunt inductor $L_1$).

Figure 2:
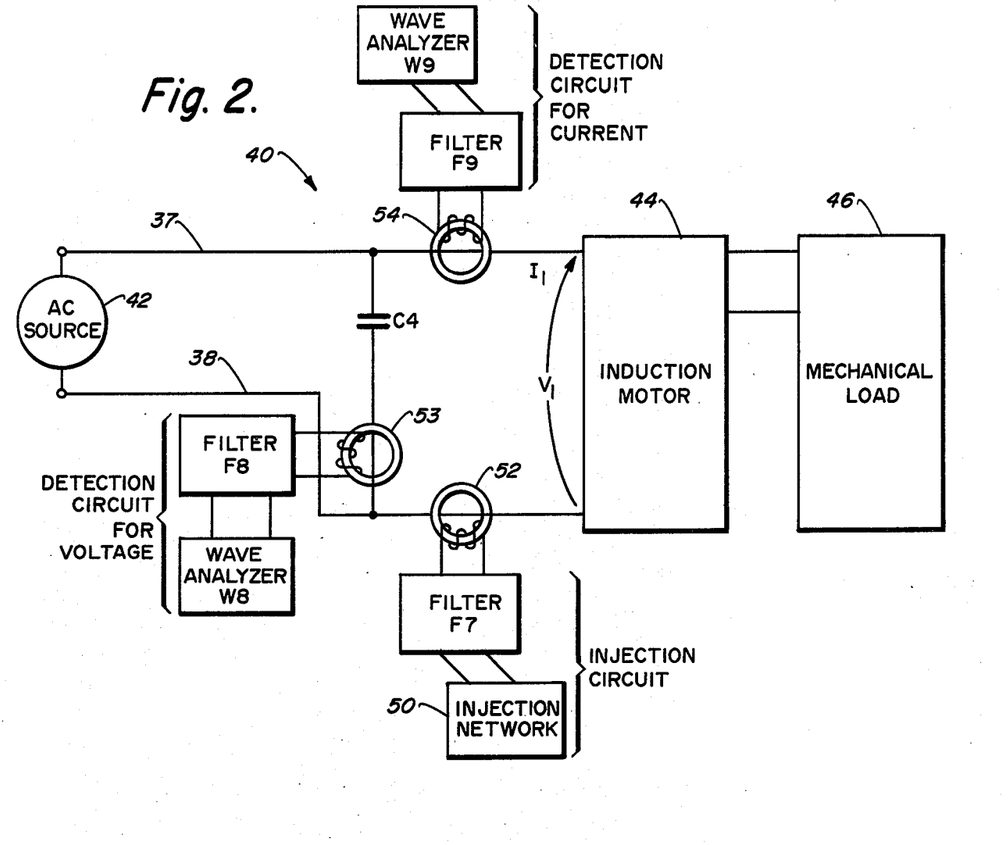
FIG. 2 is a schematic block diagram of the transfer immitance measuring system for determing the characteristic transfer immitances of a single port electrical network in accordance with the present invention.

The mode of operation of the transfer immitance measurement system according to the present invention is as follows. Consider first, the technique for characterizing a one-port linear electrical network. Referring to FIG. 2, a 60-Hz a.c. power source 42 is coupled via lines 37 and 38 to an induction motor 44. An injection network 50 generates a high frequency signal which is coupled through a filter F7 to a clamp-on ferromagnetic core 52 (positioned around line 38). The high frequency component of the port current $I_1$ is measured by means of a clamp-on ferromagnetic core 54 (positioned around line 37) coupled through a filter F9 to a wave analyzer W9. The high frequency component of port voltage $V_1$ is measured by means of a shunt capacitor $C_4$ together with a ferromagnetic core 53 coupled through a filter F8 to a wave analyzer W8. (The above discussion relating to filters F1 to F6 applies equally to filters F7 to F9.) Now to establish the transfer immitances, impedance and admittance, of the single-port linear electrical network 44, a high frequency signal is injected on line 38 and the high frequency component of the port current $I_1$ and the high frequency component of the port voltage $V_1$ are measured. Then for electrical network 44, the impedance Z and the admittance Y are determined according to the following relation:

$$Z = V_h/I_h \qquad (8)$$

$$Y = I_h/V_h \qquad (9)$$

where $V_h$ and $I_h$ represent the high frequency components of port voltage and current.

In the case of an electrical network having two or more ports, the characteristic impedance z and admittance y parameters are determined using the open- and short-circuit techniques described above and embodied in equations (3), (4), (5) and (6). Specifically, for the two-port linear electrical network 11 shown in FIG. 2 and described in the preferred embodiment, the characteristic transfer immitances can be written in matrix form as follows.

$$[Z] = \begin{bmatrix} Z_{11} & Z_{12} \\ Z_{21} & Z_{22} \end{bmatrix} \quad (10)$$

$$[Y] = \begin{bmatrix} Y_{11} & Y_{12} \\ Y_{21} & Y_{22} \end{bmatrix} \quad (11)$$

where [Z] defines the impedance matrix and [Y] defines the admittance matrix for the electrical network. The impedance [Z] and admittance [Y] matrices are established according to the relations given in equations (3) and (4). In operation, high frequency injection network 20 injects high frequency signals simultaneously into both ports of electrical network 11. The relative phase and amplitudes of these injected high frequency signals are carefully adjusted to obtain a minimum in the reading for the high frequency component of port current or the high frequency component of port voltage, simulating, respectively, the open-circuit and short-circuit conditions embodied in equations (3) and (4). Thus, to determine the characteristic z-parameters of the electrical network 11, the relative phase and amplitudes of the injected high frequency signals are first adjusted to obtain a minimum in the reading for the high frequency component of port current $I_2$, $I_{h2}$ (subscript h is used to designate high frequency components). With $I_{h2}$ approximately zero, an open circuit condition exists for the high frequency component of the port current $I_2$ but not for the 60-Hz component which is not affected. Wave analyzers W3, W6 and W4 are then used to measure the high frequency components $V_{h1}$, $V_{h2}$ and $I_{h1}$, respectively, to provide the values for $Z_{11}$ and $Z_{21}$ from equation (3), i.e., $$Z_{11} = \left. \frac{V_{h1}}{I_{h1}} \right|_{I_{h2}=0}$$

$$Z_{21} = \left. \frac{V_{h2}}{I_{h1}} \right|_{I_{h2}=0}$$

In a similar fashion, the relative phases and amplitudes of the injected high frequency signals are adjusted to obtain a minimum in the reading on wave analyzer W4 for the high frequency component $I_{h1}$ of port current $I_1$, and the values of $Z_{12}$ and $Z_{22}$ are determined from equation (3).

The characteristic y-parameters for the transfer admittance matrix [Y] for electrical network 11 are determined as follows. The relative phases and amplitudes of the injected high frequency signals are adjusted to obtain a minimum in the high frequency component of current through shunt capacitor C2, $I_{hC2}$. As $I_{hC2}$ approaches zero, $V_{h2}$ approaches zero; that is, a simulated short circuit is established in the high frequency range. Again, the 60-Hz component of port voltage $V_2$ is not affected. Wave analyzers W3, W4 and W5 measure the high frequency component values $V_{h1}$, $I_{h1}$ and $I_{h2}$, respectively, and the admittance matrix values $Y_{11}$ and $Y_{21}$ are calculated according to equation (4);

$$Y_{11} = \left. \frac{I_{h1}}{V_{h1}} \right|_{V_{h2}=0}$$

$$Y_{21} = \left. \frac{I_{h2}}{V_{h1}} \right|_{V_{h2}=0}$$

Similarly, the relative phases and amplitudes of the injected high frequency signals are adjusted to obtain a minimum in the high frequency component $I_{hC1}$ of current through shunt capacitor $C_1$ and, consequently, in the high frequency component $V_{h1}$ of the port voltage $V_1$. The admittance matrix values $Y_{12}$ and $Y_{22}$ are determined according to equation (4).

By the above described procedure, it is possible through the measurement of injected high frequency signals, to determine the characteristic transfer immitances, impedance and admittance, of two-port linear electrical network 11 without affecting the 60-Hz power signal or the normal on-line operation of the electrical network. Of course, the above described procedure can be readily generalized to accomodate electrical networks of three or more ports. And, by reason of the superposition theorem, the characteristic z- and y-parameter values determined in the high frequency range can then be extrapolated to give the results for operation at 60 Hz. For certain networks, however, the measurement and determination of both the z- and y-parameters may be difficult. A null in the high frequency component of port current (open circuit condition) or in the high frequency component of port voltage (closed circuit condition) may be difficult to obtain consistently. Also, since the high frequency components of the currents to be measured are generally small, sporadic noise and harmonics may distort the readings appearing on the wave analyzers. In this case, it should be remembered that only one set of characteristic parameters need be empirically determined. If either the characteristic impedance [Z] matrix or the characteristic admittance [Y] matrix is determined, the other immitance matrix can be determined according to equations (5) and (6). Thus, $$[Z] = [Y]^{-1} = \frac{\begin{bmatrix} y_{22} & -y_{21} \\ -y_{12} & y_{11} \end{bmatrix}}{Det\begin{bmatrix} y_{11} & y_{12} \\ y_{21} & y_{22} \end{bmatrix}} \quad (12)$$

Obviously, other embodiments and modifications of the present invention will readily come to those of ordinary skill in the art having the benefit of the teachings presented in the foregoing description and the drawings. It is therefore to be understood that this invention is not to be limited thereto and that said modifications and embodiment are intended to be included within the scope of the appended claims.

What is claimed is:
1. A system for measuring the transfer immitances, impedance and admittance, of a linear electrical network with one or more ports, each port being characterized by a port voltage and a port current, and the electrical network being coupled to receive a relatively low frequency power signal, without interrupting the normal on-line operation of the electrical network; said system comprising:
   a. high frequency signal generating means for generating a high frequency signal for each of the ports of the electrical network; each of said high fre- quency signals being of a single frequency and being independently adjustable in amplitude and phase;

b. injecting means coupled to said high frequency signal generating means for simultaneously injecting each of said high frequency signals into a respective port without interrupting the normal on-line operation of the electrical network, such that a high frequency component is superimposed on each port current and each port voltage;

c. high frequency current measuring means coupled to each port of the electrical network for simultaneously measuring the high frequency component of the port current for each of the ports of the electrical network; and d. high frequency voltage measuring means coupled to each port of the electrical network for simultaneously measuring the high frequency component of the port voltage for each of the ports of the electrical network;

e. said transfer immitances being determinable according to the relationships:

$$Z_{ij} = \frac{V_i}{I_j} \bigg|_{\substack{I_k \simeq 0 \\ \text{all } k \\ k \neq j}}$$

$$Y_{ij} = \frac{I_i}{V_j} \bigg|_{\substack{V_k \simeq 0 \\ \text{all } k \\ k \neq j}}$$

wherein $Z_{ij}$ defines an impedance matrix $[Z]$; $Y_{ij}$ defines an admittance matrix $[Y]$; $V_i$, $V_j$, and $V_k$ designate high frequency components of the port voltages; and $I_i$, $I_j$ and $I_k$ designate high frequency components of port currents; said high frequency signal generator means being operable (in the case where the electrical network includes two or more ports) to minimize the high frequency component of the port currents designated $I_k$, simulating open circuits, and the high frequency components of the port voltages designated $V_k$, simulating closed circuits, by controlling the relative amplitudes and phases of said high frequency signals injected into the ports of the electrical network.

2. The system as recited in claim 1 wherein the electrical network includes a single port and wherein said high frequency signal generating means comprises a high frequency signal generator.

3. The system as recited in claim 2 wherein said high frequency signal generating means further comprises an amplifier coupled to said high frequency signal generator.

4. The system as recited in claim 3 wherein said injecting means comprises a clamp-on ferromagnetic core (52) electromagnetically coupled to said single port.

5. The system as recited in claim 4 wherein said injecting means further comprises:

a. a first L-section filter coupled between said clamp-on ferromagnetic core (52) and said amplifier; said L-section filter comprising a series capacitor and a parallel inductor;

b. said first L-section filter being utilized to attenuate any low frequency power-signal component of the port current in said single port induced in said clamp-on ferromagnetic core (52).

6. The system as recited in claim 5 wherein said injecting means further comprises a shunt inductor coupled across said clamp-on ferromagnetic core (52), between said clamp-on ferromagnetic core (52) and said first L-section filter; said shunt inductor across said clamp-on ferromagnetic core (52) being utilized to prevent said first clamp-on ferromagnetic core from becoming saturated.

7. The system as recited in claim 5 wherein said high frequency current measuring means comprises:

a. a clamp-on ferromagnetic core (54) electromagnetically coupled to said single port; and b. a wave analyzer (W9) coupled to said clamp-on ferromagnetic core (54) to measure the high frequency component of the port current in said single port.

8. The system as recited in claim 7 wherein said high frequency current measuring means further comprises:

a. a second L-section filter coupled between said clamp-on ferromagnetic core (54) and said wave analyzer (W9); said second L-section filter comprising a series capacitor and a parallel inductor;

b. said second L-section filter being utilized to attenuate any low frequency power-signal component of the port current in said single port induced in said clamp-on ferromagnetic core (54).

9. The system as recited in claim 8 wherein said current measuring means further comprises a shunt inductor coupled across said clamp-on ferromagnetic core (54), between said clamp-on ferromagnetic core (54) and said second L-section filter; said shunt inductor across said clamp-on ferromagnetic core (54) being utilized to prevent said clamp-on ferromagnetic core (54) from becoming saturated.

10. The system as recited in claim 8 wherein said high frequency voltage measuring means comprises:

a. a shunt capacitor ($C_4$) coupled across said single port; said shunt capacitor ($C_4$) being chosen to exhibit a very high impedance to the low frequency power-signal component of the port current and a very low impedance to the injected high frequency component of the port current in said single port;

b. a clamp-on ferromagnetic core (53) electromagnetically coupled to said shunt capacitor ($C_4$); and c. a wave analyzer (W8) coupled to said clamp-on ferromagnetic core (53) to measure the high frequency component of port current through said shunt capacitor ($C_4$), thereby establishing the high frequency component of the port voltage for said single port.

11. The system as recited in claim 10 wherein said high frequency voltage measuring means further comprises:

a. a third L-section filter coupled between said clamp-on ferromagnetic core (53) and said wave analyzer (W8); said third L-section filter comprising a series capacitor and a parallel inductor;

b. said third L-section filter being utilized to attenuate any low frequency power-signal component of the current through said shunt capacitor ($C_4$) induced in said clamp-on ferromagnetic core (53).

12. The system as recited in claim 11 further comprising a shunt inductor coupled across said clamp-on ferromagnetic core (53), between said clamp-on ferromagnetic core (53) and said third L-section filter; said shunt inductor coupled across said clamp-on ferromagnetic core (53) being utilized to prevent said third clamp-on ferromagnetic core (53) from becoming saturated.

13. The system as recited in claim 1 wherein the linear electrical network includes two or more ports and wherein said high frequency signal generating means comprises:
   a. a high frequency signal generator;
   b. an amplifier coupled to said high frequency signal generator having at least an output channel for each port of the electrical network; said amplifier being capable of independently controlling the amplitudes of the high frequency signals appearing on the output channels of said amplifier; and
   c. phase shifting means coupled to said amplifier for independently controlling the relative phases of the high frequency signals appearing on the output channels of said amplifier.

14. The system as recited in claim 13 wherein said phase shifting means comprises a plurality of phase shift networks such that a separate phase shift network is associated with each but one of the output channels of said amplifier; each phase shift network being operable to control the phase of the high frequency signal appearing on a respective output channel of said amplifier.

15. The system as recited in claim 13 wherein said injecting means comprises a plurality of injecting networks, each being coupled between a respective output channel of said amplifier and a respective port of the electrical network; each of said injecting networks comprising a respective clamp-on ferromagnetic core electromagnetically coupled to a respective port of the electrical network.

16. The system as recited in claim 15 wherein each of said injecting networks further comprises:
   a. a respective L-section filter coupled between a respective clamp-on ferromagnetic core and a respective output channel of said amplifier; said respective L-section filter comprising a series capacitor and a parallel inductor;
   b. said respective L-section filter being utilized to attenuate any low frequency power-signal component of a respective port current induced in said respective clamp-on ferromagnetic core.

17. The system as recited in claim 16 wherein each of said injecting networks further comprises a respective shunt inductor coupled across a respective clamp-on ferromagnetic core, between said respective ferromagnetic core and a respective L-section filter; said respective shunt inductor being utilized to prevent said respective clamp-on ferromagnetic core from becoming saturated.

18. The system as recited in claim 16 wherein said high frequency current measuring means comprises a plurality of high frequency current measuring networks, each being coupled to a respective port of the electrical network; each of said high frequency current measuring networks comprising:
   a. a respective clamp-on ferromagnetic core electromagnetically coupled to a respective port of the electrical network; and
   b. a respective wave analyzer coupled to said clamp-on ferromagnetic core.

19. The system as recited in claim 18 wherein each of said high frequency current measuring networks further comprises:
   a. a respective L-section filter coupled between a respective clamp-on ferromagnetic core and a respective wave analyzer; said respective L-section filter comprising a series capacitor and a parallel inductor;
   b. said respective L-section filter being utilized in a respective high frequency current measuring network to attenuate any low frequency power-signal component induced in said respective clamp-on ferromagnetic core.

20. The system as recited in claim 19 wherein each of said high frequency current measuring networks further comprises a respective shunt inductor coupled across a respective clamp-on ferromagnetic core, between said respective clamp-on ferromagentic core and a respective L-section filter, said respective shunt indicator being utilized to prevent said respective clamp-on ferromagnetic core from becoming saturated.

21. The system as recited in claim 19 wherein said high frequency voltage measuring means comprises a plurality of high frequency voltage measuring networks, each being coupled to a respective port of the electrical network; each of said high frequency voltage measuring networks comprising:
   a. a respective shunt capacitor coupled across a respective port; said respective shunt capacitor being chosen to exhibit a high impedance to the low frequency power-signal component and a low impedance to the injected high frequency component of the port current in a respective port of the electrical network;
   b. a respective clamp-on ferromagnetic core electromagnetically coupled to said respective shunt capacitor; and
   c. a respective wave analyzer coupled to said respective clamp-on ferromagnetic core.

22. The system as recited in claim 21 wherein each of said high frequency voltage measuring networks further comprises:
   a. a respective L-section filter coupled between a respective clamp-on ferromagnetic core and a respective wave analyzer; said respective L-section filter comprising a series capacitor and parallel inductor;
   b. said respective L-section filter being utilized to attenuate any low frequency power-signal component of the current through said respective shunt capacitor induced in said respective clamp-on ferromagnetic core.

23. The system as recited in claim 22 wherein each of said high frequency voltage measuring networks further comprises a respective shunt inductor coupled in parallel with a respective clamp-on ferromagnetic core, between said respective clampon ferromagnetic core and a respective L-section filter; said respective shunt inductor being utilized to prevent said respective clamp-on ferromagnetic core from becoming saturated.

24. The system as recited in claim 22 wherein each of said high frequency voltage measuring networks further comprises a respective shunt inductor coupled in parallel with a respective clamp-on ferromagnetic core, between said respective clamp-on ferromagnetic core and a respective L-section filter, said respective shunt inductor being utilized to prevent said respective clamp-on ferromagnetic core from becoming saturated.

25. A system for measuring the transfer immitances, impedance and admittance, of a linear electrical network with a single port characterized by a port voltage and a port current, the electrical network being coupled to receive a relatively low frequency power signal, without interrupting the normal on-line operation of the electrical network; said system comprising:
   a. high frequency signal generating means for generating a high frequency signal;

b. injecting means coupled to said high frequency signal generating means for injecting said high frequency signal into the port of the electrical network without interrupting normal on-line operation, such that a high frequency component is superimposed on the port current and the port voltage;

c. high frequency current measuring means coupled to the port of the electrical network for measuring the high frequency component of the port current; and d. high frequency voltage measuring means coupled to the port of the electrical network for measuring the high frequency component of the port voltage;

e. said transfer immitances being determinable according to the relationships:

$$Z = V/I$$

$$Y = I/V$$

wherein Z designates the impedance; Y designates the admittance; V designates the high frequency component of the port voltage; and I designates the high frequency component of the port current.

26. The system as recited in claim 25 wherein said high frequency signal generating means comprises a high frequency signal generator.

27. The system as recited in claim 26 wherein said high frequency signal generating means further comprises an amplifier coupled to said high frequency signal generator.

28. The system as recited in claim 27 wherein said injecting means comprises a clamp-on ferromagnetic core (52) electromagnetically coupled to the single port.

29. The system as recited in claim 28 wherein said injecting means further comprises;

a. a first L-section filter coupled between said clamp-on ferromagnetic core (52) and said amplifier; said L-section filter comprising a series capacitor and a parallel inductor;

b. said first L-section filter being utilized to attenuate any low frequency power-signal component of the port current in the single port which is induced in said clamp-on ferromagnetic core (52).

30. The system as recited in claim 29 wherein said injecting means further comprises a shunt inductor coupled across said clamp-on ferromagnetic core (52) between said clamp-on ferromagnetic core (52) and said first L-section filter; said shunt inductor across said clamp-on ferromagnetic core (52) being utilized to prevent said first clamp-on ferromagnetic core from becoming saturated.

31. The system as recited in claim 29 wherein said high frequency current measuring means comprises:

a. a clamp-on ferromagnetic core (54) electromagnetically coupled to the single port; and b. a wave analyzer (W9) coupled to said clamp-on ferromagnetic core (54) to measure the high frequency component of the port current in the single port.

32. The system as recited in claim 31 wherein said high frequency current measuring means further comprises:

a. a second L-section filter coupled between said clamp-on ferromagnetic core (54) and said wave analyzer (W9); said second L-section filter comprising a series capacitor and a parallel inductor;

b. said second L-section filter being utilized to attenuate any low frequency power-signal component of the port current in the single port which is induced in the said clamp-on ferromagnetic core (54).

33. The system as recited in claim 32 wherein said current measuring means further comprises a shunt inductor coupled across said clamp-on ferromagnetic core (54), between said clamp-on ferromagnetic core (54) and said second L-section filter; said shunt inductor across said clamp-on ferromagnetic core (54) being utilized to prevent said clamp-on ferromagnetic core (54) from becoming saturated.

34. The system as recited in claim 32 wherein said high frequency voltage measuring means comprises:

a. a shunt capacitor ($C_4$) coupled across the single port; said shunt capacitor ($C_4$) being chosen to exhibit a very high impedance to the low frequency power-signal component of the port current and a very low impedance to the injected high frequency component of the port current in said single port;

b. a clamp-on ferromagnetic core (53) electromagnetically coupled to said shunt capacitor ($C_4$); and c. a wave analyzer (W8) coupled to said clamp-on ferromagnetic core (53) to measure the high frequency component of port current through said shunt capacitor ($C_4$), thereby establishing the high frequency component of the port voltage for said single port.

35. The system as recited in claim 34 wherein said high frequency voltage measuring means further comprises:

a. a third L-section filter coupled between said clamp-on ferromagnetic core (53) and said wave analyzer (W8); said third L-section filter comprising a series capacitor and a parallel inductor;

b. said third L-section filter being utilized to attenuate any low frequency power-signal component of the current through said shunt capacitor ($C_4$) induced in said clamp-on ferromagnetic core (53).

36. The system as recited in claim 35 further comprising a shunt inductor coupled across said clamp-on ferromagnetic core (53), between said clamp-on ferromagnetic core (53) and said third L-section filter; said shunt inductor coupled across said clamp-on ferromagnetic core (53) being utilized to prevent said third clamp-on ferromagnetic core (53) from becoming saturated.

37. A system for measuring the transfer immitances, impedance and admittance, of a linear electrical network with two or more ports, each port being characterized by a port voltage and a port current, and the electrical network being coupled to receive a relatively low frequency power signal, without interrupting the normal on-line operation of the electrical network; said system comprising:

a. high frequency signal generating means for generating a high frequency signal for each of the ports of the electrical network; each of said high frequency signals being of a single frequency and being independently adjustable in amplitude and phase;

b. injecting means coupled to said high frequency signal generating means for simultaneously injecting each of said high frequency signals into a respective port without interrupting the normal on-line operation of the electrical network, such that a high frequency component is superimposed on each port current and each port voltage;

c. high frequency current measuring means coupled to each port of the electrical network for simultaneously measuring the high frequency component of the port current for each of the ports of the electrical network; and
d. high frequency voltage measuring means coupled to each port of the electrical network for simultaneously measuring the high frequency component of the port voltage for each of the ports of the electrical network;
e. said transfer immitances being determinable according to the relationships:

$$Z_{ij} = \frac{V_i}{I_j} \bigg|_{\substack{I_k \simeq 0 \\ \text{all } k \\ k \neq j}}$$

$$Y_{ij} = \frac{I_i}{V_j} \bigg|_{\substack{V_k \simeq 0 \\ \text{all } k \\ k \neq j}}$$

wherein $Z_{ij}$ defines an impedance matrix $[Z]$; $Y_{ij}$ defines an admittance matrix $[Y]$; $V_i$, $V_j$, and $V_k$ designate high frequency components of the port voltages; and $I_i$, $I_j$ and $I_k$ designate high frequency components of port currents; said high frequency signal generator means being operable to minimize the high frequency component of the port currents designated $I_k$, simulating open circuits, and the high frequency components of the port voltages designated $V_k$, simulating closed circuts, by controlling the relative amplitudes and phases of said high frequency signals injected into the ports of the electrical network.

38. The system as recited in claim 37 wherein said high frequency signal generating means comprises:
a. a high frequency signal generator;
b. an amplifier coupled to said high frequency signal generator having at least an output channel for each port of the electrical network; said amplifier being capable of independently controlling the amplitudes of the high frequency signals appearing on the output channels of said amplifier; and
c. phase shifting means coupled to said amplifier for independently controlling the relative phases of the high frequency signals appearing on the output channels of said amplifier.

39. The system as recited in claim 38 wherein said phase shifting means comprises a plurality of phase shift networks such that a separate phase shift network is associated with each but one of the output channels of said amplifier; each phase shift network being operable to control the phase of the high frequency signal appearing on a respective output channel of said amplifier.

40. The system as recited in claim 38 wherein said injecting means comprises a plurality of injecting networks, each being coupled between a respective output channel of said amplifier and a respective port of the electrical network; each of said injecting networks comprising a respective clamp-on ferromagnetic core electromagnetically coupled to a respective port of the electrical network.

41. The system as recited in claim 40 wherein each of said injecting networks further comprises:
a. a respective L-section filter coupled between a respective clamp-on ferromagnetic core and a respective output channel of said amplifier; said respective L-section filter comprising a series capacitor and a parallel inductor;
b. said respective L-section filter being utilized to attenuate any low frequency power-signal component of a respective port current which is induced in said respective clamp-on ferromagnetic core.

42. The system as recited in claim 41 wherein each of said injecting networks further comprises a respective shunt inductor coupled across a respective clamp-on ferromagnetic core, between said respective ferromagnetic core and a respective L-section filter; said respective shunt inductor being utilized to prevent said respective clamp-on ferromagnetic core from becoming saturated.

43. The system as recited in claim 41 wherein said high frequency current measuring means comprises a plurality of high frequency current measuring networks, each being coupled to a respective port of the electrical network; each of said high frequency current measuring networks comprising:
a. a respective clamp-on ferromagnetic core electromagnetically coupled to a respective port of the electrical network; and
b. a respective wave analyzer coupled to said respective clamp-on ferromagnetic core.

44. The system as recited in claim 43 wherein each of said high frequency current measuring networks further comprises:
a. a respective L-section filter coupled between a respective clamp-on ferromagnetic core and a respective wave analyzer; said respective L-section filter comprising a series capacitor and a parallel inductor;
b. said respective L-section filter being utilized in a respective high frequency current measuring network to attenuate any low frequency power-signal component which is induced in said respective clamp-on ferromagnetic core.

45. The system as recited in claim 44 wherein each of said high frequency current measuring networks further comprises a respective shunt inductor coupled across a respective clamp-on ferromagnetic core, between said respective clamp-on ferromagnetic core and a respective L-section filter, said respective shunt inductor being utilized to prevent said respective clamp-on ferromagnetic core from becoming saturated.

46. The system as recited in claim 44 wherein said high frequency voltage measuring means comprises a plurality of high frequency voltage measuring networks, each being coupled to a respective port of the electrical network; each of said high frequency voltage measuring networks comprising:
a. a respective shunt capacitor coupled across a respective port; said respective shunt capacitor being chosen to exhibit a high impedance to the low frequency power-signal component and a low impedance to the injected high frequency component of the port current in a respective port of the electrical network;
b. a respective clamp-on ferromagnetic core electromagnetically coupled to said respective shunt capacitor; and
c. a respective wave analyzer coupled to said respective clamp-on ferromagnetic core.

47. The system as recited in claim 46 wherein each of said high frequency voltage measuring networks further comprises:
a. a respective L-section filter coupled between a respective clamp-on ferromagnetic core and a respective wave analyzer; said respective L-section filter comprising a series capacitor and parallel inductor;

b. said respective L-section filter being utilized to attenuate any low frequency power-signal component of the current through said respective shunt capacitor which is induced in said respective clamp-on ferromagnetic core.

* * * * *